US007005234B2

(12) United States Patent
Hoshi et al.

(10) Patent No.: US 7,005,234 B2
(45) **Date of Patent: *Feb. 28, 2006**

(54) PLANOGRAPHIC PRINTING PLATE PRECURSOR AND PLANOGRAPHIC PRINTING METHOD

(75) Inventors: Satoshi Hoshi, Shizuoka-ken (JP); Keitaro Aoshima, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 566 days.

This patent is subject to a terminal disclaimer.

(21) Appl. No.: 10/101,316

(22) Filed: Mar. 20, 2002

(65) Prior Publication Data

US 2002/0177074 A1 Nov. 28, 2002

(30) Foreign Application Priority Data

Mar. 26, 2001 (JP) ...................................... 2001-087637

(51) Int. Cl.
*G03F 7/038* (2006.01)

(52) U.S. Cl. .................... 430/286.1; 430/302; 430/348; 430/494; 430/944; 430/945; 101/453; 101/467

(58) Field of Classification Search ............. 430/270.1, 430/281.1, 283.1, 284.1, 285.1, 286.1, 287.1, 430/288.1, 302, 348, 494, 944, 945, 964; 101/453, 463.1, 465, 466, 467
See application file for complete search history.

(56) References Cited

U.S. PATENT DOCUMENTS

| | | | | |
|---|---|---|---|---|
| 3,725,356 | A | | 4/1973 | Luders |
| 3,839,171 | A | | 10/1974 | Akamatsu et al. |
| 4,019,972 | A | | 4/1977 | Faust |
| 4,476,215 | A | | 10/1984 | Kausch |
| 4,499,163 | A | | 2/1985 | Ishimaru et al. |
| 4,510,227 | A | | 4/1985 | Mohr et al. |
| 4,772,538 | A | | 9/1988 | Walls et al. |
| 4,950,581 | A | | 8/1990 | Koike et al. |
| 4,952,478 | A | | 8/1990 | Miyagawa et al. |
| 5,080,999 | A | | 1/1992 | Imai et al. |
| 5,200,292 | A | * | 4/1993 | Shinozaki et al. .......... 430/178 |
| 5,246,816 | A | | 9/1993 | Yamasita et al. |
| 5,340,699 | A | | 8/1994 | Haley et al. |
| 5,641,608 | A | | 6/1997 | Grunwald et al. |
| 5,705,322 | A | | 1/1998 | West et al. |
| 5,919,601 | A | | 7/1999 | Nguyen et al. |
| 5,952,154 | A | | 9/1999 | Barr et al. |
| 5,965,319 | A | | 10/1999 | Kobayashi |
| 6,013,412 | A | | 1/2000 | Aoshima |
| 6,030,750 | A | | 2/2000 | Vermeersch et al. |
| 6,309,792 | B1 | * | 10/2001 | Hauck et al. ............ 430/270.1 |
| 6,399,689 | B1 | | 6/2002 | Scarlette |
| 6,423,462 | B1 | | 7/2002 | Kunita |
| 6,482,571 | B1 | * | 11/2002 | Teng .......................... 430/302 |
| 6,566,035 | B1 | | 5/2003 | Aoshima |
| 6,576,401 | B1 | * | 6/2003 | Teng .......................... 430/303 |
| 2002/0160295 | A1 | * | 10/2002 | Aoshima et al. ............ 430/176 |
| 2003/0008239 | A1 | | 1/2003 | Fujimaki et al. |
| 2003/0073032 | A1 | * | 4/2003 | Aoshima ................. 430/271.1 |
| 2003/0082478 | A1 | * | 5/2003 | Itakura et al. ........... 430/270.1 |

FOREIGN PATENT DOCUMENTS

| | | |
|---|---|---|
| CA | 1338095 | 2/1996 |
| EP | 0 377 321 A2 | 7/1990 |
| EP | 0 684 522 A1 | 11/1995 |
| EP | 0 779 161 A1 | 6/1997 |
| EP | 0 919 870 A1 | 6/1999 |
| EP | 0 950 517 A1 | 10/1999 |
| EP | 0 950 518 A1 | 10/1999 |
| EP | 1 072 955 A2 | 1/2001 |
| EP | 1 096 315 A1 | 5/2001 |
| JP | 2-161442 A | 6/1990 |
| JP | 8-062834 | 3/1996 |
| WO | 00/48836 A1 | 8/2000 |

OTHER PUBLICATIONS

Product Data, Scripset 550 Styrene Maleic Anhydride Copolymer Solid, Hercules Incorporated, Copyright 1999, Jun. 2000 from Internet.

"benzyl" from The American Heritage Dictionary of the English Language, 2000, Houghton Mifflin Company, Fourth Ed., found at yourdictionary.com, 1 page.

Registry No. 2154–56–5, common name "benzyl" from ACS, 2003, STIN database search.

McGinniss, Vincent D., "Radiation Curing: 6. Curing with Ultraviolet, Visible and Infrared Processing Equipment", 1996, John Wiley & Sons, Inc., Article Online posting date Dec. 4, 2000.

Product bulletin: SR–295, SARTOMER Company, Exton, PA, one page, dated Nov. 1998 from Internet through Sartomer website.

Product bulletin: SR–399, SARTOMER Company, Exton, PA, one page, dated Nov. 1998 from Internet through Sartomer website.

Product bulletin: SR–492, SARTOMER Company, Exton, PA, one page, dated Nov. 1998 from Internet through Sartomer website.

Product bulletin: CD–501, SARTOMER Company, Exton, PA, one page, dated May 1999 from Internet through Sartomer website.

Product bulletin: SR–368, SARTOMER Company, Exton, PA, two pages, dated Nov. 1998 from Internet through Sartomer website.

* cited by examiner

*Primary Examiner*—Mark F. Huff
*Assistant Examiner*—Barbara Gilliam
(74) *Attorney, Agent, or Firm*—Burns, Doane, Swecker & Mathis, LLP

(57) ABSTRACT

The present invention provides a planographic printing plate precursor comprising a photosensitive layer on a support, the photosensitive layer including an infrared absorbent, a radical polymerization initiator and a radical polymerizing compound, the photosensitive layer being recordable with irradiation with an infrared ray, and being at least one of soluble and dispersible in water.

19 Claims, No Drawings

PLANOGRAPHIC PRINTING PLATE PRECURSOR AND PLANOGRAPHIC PRINTING METHOD

BACKGROUND OF THE INVENTION

1. Field of the Invention

The present invention relates to a planographic printing plate precursor and a printing method for a planographic printing plate using the same. More particularly, the present invention relates to a planographic printing plate precursor that can be used for direct plate-making by scanning the plate with an infrared laser on the basis of digital signals from a computer, or the like, and to a planographic printing method using the planographic printing plate precursor wherein the printing plate can be developed on a printing machine.

2. Description of the Related Art

Generally, a planographic printing plate is formed of lipophilic image portions which receive ink during printing, and hydrophilic non-image portions which receive dampening water.

Planographic printing utilizes a property of water and oil based ink repelling each other, wherein the lipophilic image portions are used as ink receiving areas and the hydrophilic non-image portions are used as dampening water receiving areas (non-ink-receiving areas). In this printing method, ink is thinly deposited on only the image portions, and then the ink is transferred onto a medium which is printed, such as paper, to print the image. Conventionally, a PS plate provided with a lipophilic photosensitive resin layer on a hydrophilic substrate thereof has been widely used. In a plate-making method for the PS plate, usually, a planographic printing plate precursor is exposed through an original image such as a lith film. Thereafter, the photosensitive layer is left at the image portions, and that at the non-image portions are dissolved and removed using a developing solution to expose the surface of the aluminum substrate. Thus, a desired printing plate is obtained.

In the conventional plate-making process for the PS plate, after the exposure, a process which dissolves and removes the photosensitive layer at the non-image portions using a developing solution, or the like, which is suitable for the photosensitive layer, is necessary. One task is to eliminate or simplify this additional wet type treatment. Particularly in recent years, with consideration of the global environment, disposal of waste liquid produced during the wet type treatment is a great concern of the whole industrial world. Therefore, there is an increasing demand for improvements in this regard.

As a simple plate-making method corresponding to these demands, a method using a photosensitive layer, which is able to be removed from the non-image portions of the printing plate precursor in a usual printing process, wherein, after being exposed with light, the printing plate is developed on a printing machine to obtain a final printing plate, has been proposed. This plate-making method for a planographic printing plate is called on-machine development. Specifically, the method includes, for example, use of a photosensitive layer which is soluble in dampening water or a solvent for ink, mechanical removal of the photosensitive layer at the non-image portions by contacting them with an impression cylinder or a blanket cylinder in the printing machine, or the like. However, since an image formed in the photosensitive layer is not fixed until it is developed after exposure in conventional image recording methods, which utilize ultra violet or visible light, handling of the exposed printing plate for on-machine developing is troublesome because the printing plate has to be completely shielded from light and stored at a constant temperature before it is set in a printing machine.

In this field in recent years, digitized techniques which electronically process, store and output image information using a computer have widely spread, and various types of newly developed image output techniques for use with such digitized techniques have been put into practice. Accompanying this, a computer-to-plate technique, in which a printing plate precursor is scan-exposed with highly convergent radiation, such as a laser beam, which is modified based on digitized image information to directly produce a printing plate without using a lith film, has been attracting attention. Along with this, it has become technically important to obtain a printing plate precursor which is suitable for this purpose.

Therefore, a simplification of plate-making process and an introduction of dry-type processing are more strongly desired than in the past from the above-described environmental point of view and necessity for adaptation to the digitized techniques.

Since high-output semiconductor lasers or solid state lasers such as a YAG laser are now available at low prices, particularly, a plate-making method which employs such lasers as image recording means has been regarded as a favorable method for producing a printing plate by scan-exposure which can be readily incorporated into the digitized techniques. In a conventional plate-making method, image recording is carried out by performing imagewise exposure onto a photosensitive printing plate precursor with low- to mid-level illumination, thereby causing an imagewise change in physical properties of the surface of the printing plate precursor by a photo-chemical reaction. In a method using high-power-density exposure employing a high-output laser, areas to be exposed are irradiated by a large quantity of concentrated light energy for a very short time and the light energy is efficiently converted into thermal energy. The heat is used to cause a change such as a chemical change, a phase change, a change in form or structure, or the like, and the change is utilized for image recording. That is, image information is input by light energy such as a laser beam, and an image is recorded by a reaction caused by thermal energy. Usually, such a recording method utilizing heat generated by the high-power-density exposure is called heat-mode recording, and conversion of light energy into thermal energy is called photo-thermal conversion.

A major advantage of a plate-making method utilizing heat-mode recording means is that a photosensitive material used for the heat-mode recording is not sensitive to light at normal illumination levels such as room light, and an image recorded by high-illumination exposure is not necessarily fixed. That is, when a heat-mode photosensitive material is used for recording an image, it is insensitive to room light before exposure, and fixing of the image after exposure is not essential. Therefore, for example, if a photosensitive layer which is rendered insoluble or soluble by heat-mode exposure is used, and a process for producing a printing plate by removing imagewise the exposed photosensitive layer is carried out in a manner of on-machine development, it is possible to provide a printing system in which an image is not affected even if the plate is exposed to ambient light for a certain time after image exposure during development, namely, removal of non-image portions. Therefore, by using heat-mode recording, a planographic printing plate precursor which is desirable for on-machine development is expected to be obtained.

Progress in laser technology has been remarkable in recent years, and high-output and small solid state lasers and semiconductor lasers, particularly those that emit an infrared ray in a wavelength range from 760 nm to 1200 nm, are readily available. These lasers are very useful as a light source for recording used for plate making directly from digital data from a computer, or the like. However, since the majority of photosensitive recording materials which are useful in practice have sensitivity to visible light having a wavelength of 760 nm or less, images cannot be recorded on them with an infrared laser. Therefore, a material which can be used for recording with an infrared laser is desired.

As an image recording material which can be used for recording with an infrared laser, a recording material comprising an infrared absorbent, an acid generator, a resol resin and a novolak resin is described in U.S. Pat. No. 5,340,699. However, for forming an image on such a negative-type image recording material, a heat treatment is required after exposure with a laser. Therefore, a negative-type image recording material which does not require a heat treatment after exposure has been desired.

For example, a recording material which comprises a cyanine dye having a certain structure, an iodonium salt and an addition-polymerizable compound having ethylenic unsaturated double bond, and which does not require heat treatment after imagewise exposure is described in Japanese Patent Application Publication (JP-B) No. 7-103171. However, this image recording material has a problem that strength of formed image portions thereof is low, thus if it is used as a planographic printing plate, the number of resulting prints which are acceptable is small.

A planographic printing plate precursor comprising a photosensitive layer provided on a hydrophilic substrate, which photosensitive layer contains fine particles of a thermoplastic hydrophobic polymer dispersed in a hydrophilic binder polymer, is disclosed in Japanese Patent No. 2,938, 397. According to this patent, the planographic printing plate precursor is exposed with an infrared laser to form an image by coalescing the fine particles of the thermoplastic hydrophobic polymer with heat. Thereafter, the plate is set on a cylinder of a printing machine, and the plate can be developed on the machine using dampening water and/or ink. Although such a method for forming an image by coalescing the fine particles by simple thermal fusing exhibits good on-machine developability, strength of the image is low, and therefore there is a problem of insufficient plate-wear resistance.

SUMMARY OF THE INVENTION

Therefore, an object of the present invention is to provide a negative-type planographic printing plate precursor, on which an image can be directly recorded from digital data from a computer, or the like, by using a solid state laser or a semiconductor laser emitting an infrared ray, which can be made into a printing plate without being wet-type developed, and which does not require heat treatment after exposure to have excellent plate-wear resistance to yield a large quantity of good prints. Another object of the present invention is to provide a planographic printing method using the planographic printing plate precursor which does not require wet-type developing.

The inventors of the present invention have studied components of a negative-type photosensitive layer in a planographic printing plate precursor, and have found through close examination that the above-described objects can be accomplished by employing a structure in which a photosensitive layer itself is soluble or dispersible in water and can form strong image portions when exposed to an infrared laser, and thus have completed the present invention.

Namely, the present invention provides a negative-type planographic printing plate precursor comprising a photosensitive layer on a support, the photosensitive layer including an infrared absorbent, a radical polymerization initiator and a radical polymerizing compound, the photosensitive layer being recordable with irradiation with an infrared ray, and being at least one of soluble and dispersible in water.

Further, the present invention provides a planographic printing method comprising the steps of: a) forming a planographic printing plate precursor by disposing a photosensitive layer able to record by irradiation with an infrared ray on a support, the photosensitive layer comprising an infrared absorbent, a radical polymerizing compound, and being at least one of soluble and dispersible in water; b) image-wise exposing the planographic printing plate precursor by one of: (i.) setting planographic printing plate precursor in a printing machine and then exposing the planographic printing plate precursor; and (ii.) exposing the planographic printing plate precursor with infrared laser light and then setting the exposed planographic printing plate in the printing machine; and c) printing by providing water components and oil based ink without use of a developing process.

DESCRIPTION OF THE PREFERRED EMBODIMENTS

Hereinafter the present invention is described in detail. A negative-type planographic printing plate precursor of the present invention comprises, on a substrate thereof, a photosensitive layer which can be used for recording by exposure with an infrared ray (that is, exposed portions thereof harden to form hydrophobic (lipophilic) areas) and which is soluble or dispersible in water (hereinafter, these properties may be referred simply as "water-soluble" in the present invention).

In the present invention, the "photosensitive layer which is soluble or dispersible in water" means a photosensitive layer which can be dissolved or dispersed in an aqueous component, such as dampening water, used in printing. Specifically, the photosensitive layer is immersed in an aqueous solution having a pH of 2–8 at room temperature, and when the photosensitive layer is physically rubbed in this state, it is dissolved or dispersed in the aqueous solution, and removed from the printing plate.

In order to make the photosensitive layer soluble or dispersible in water, it is necessary for film-forming components in the layer structure to be soluble or easily dispersible in water. Further, in order to enhance water-solubility, respective components of the image recording material are preferably water-soluble, or if they are not water-soluble, it is preferable to use hydrophilic materials, which can be easily dispersed in water, on surfaces of the components.

The respective components are described one by one below.

(A) Infrared Absorbent

In the planographic printing plate precursor of the present invention, an image can be recorded with a laser emitting infrared ray. It is preferable to use an infrared absorbent in a photosensitive layer of this type of planographic printing plate precursor. The infrared absorbent functions to convert absorbed infrared ray into heat. The heat generated at this time causes a (B) radical generator to decompose and generate radicals, and the generated radicals promote polymerization of a (C) radical polymerizing compound, and thus image portions are formed. The infrared absorbent used in the present invention can be any material as long as it functions to absorb infrared ray and convert it into heat. Preferable examples thereof include dyes, pigments, metallic particles, and the like, which effectively absorb infrared ray in a wavelength range from 760 nm to 1200 nm. From a viewpoint of high solubility or dispersibility in water, water-soluble infrared-absorbing dyes, infrared-absorbing pigments and metallic particles which have been surface-treated to be hydrophilic, and the like, are particularly preferable.

Dyes that are usable in the present invention include commercially available dyes and known dyes described in literature such as "Senryo Binran" (Dye Handbook) edited by Yuki Gosei Kagaku Kyokai (Organic Synthetic Chemistry Association), 1970. Specific examples thereof include those described in Japanese Patent Application Laid-Open (JP-A) No. 10-39509, paragraph Nos. [0050] to [0051].

Those particularly preferable among these dyes include cyanine dyes, squarylium dyes, pyrylium salts, nickel thiolate complex, and the like. Among them, cyanine dyes are more preferable, and those represented by the following general formula (I) are most preferable.

General Formula (I)

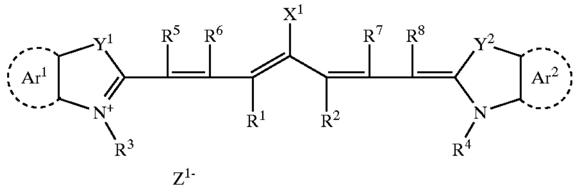

In general formula (I), $X^1$ represents a halogen atom or $X^2$—$L^1$. $X^2$ represents an oxygen atom or a sulfur atom, and $L^1$ represents a hydrocarbon group having 1–12 carbon atoms. $R^1$ and $R^2$ each independently represents a hydrocarbon group having 1–12 carbon atoms. From a viewpoint of storage stability of a photosensitive layer coating solution, each $R^1$ and $R^2$ preferably is a hydrocarbon group having 2 or more carbon atoms. More preferably, $R^1$ and $R^2$ are bonded to each other to form a five- or six-membered ring.

$Ar^1$ and $Ar^2$ may be the same or different, and respectively represent an aromatic hydrocarbon group which may have a substituent. $Y^1$ and $Y^2$ may be the same or different, and respectively represent a sulfur atom or a dialkylmethylene group having 12 or less carbon atoms. $R^3$ and $R^4$ may be the same or different, and respectively represent a hydrocarbon group having 20 or less carbon atoms which may have a substituent. Preferable substituents include an alkoxy group having 12 or less carbon atoms, a carboxyl group, and a sulfo group. $R^5$, $R^6$, $R^7$ and $R^8$ may be the same or different, and respectively represent a hydrogen atom or a hydrocarbon group having 12 or less carbon atoms. From a viewpoint of availability of raw materials, a hydrogen atom is preferable. $Z^{1-}$ represents a counter anion. Note that, if any of $R^1$ to $R^8$ has a sulfo group as a substituent, $Z^{1-}$ is not necessary. From a viewpoint of storage stability of the photosensitive layer coating solution, preferable examples of $Z^{1-}$ include a halogen ion, a perchloric acid ion, a tetrafluoroborate ion, a hexafluorophosphate ion and a sulfonic acid ion, and more preferably include a perchloric acid ion, a hexafluorophosphate ion and an arylsulfonic acid ion.

Preferable infrared absorbents for use in the present invention include water-soluble infrared-absorbing dyes which can be homogeneously added into a hydrophilic matrix such as a hydrophilic resin in the photosensitive layer and is easily soluble in water.

Specific examples of preferable water-soluble infrared-absorbing dyes [(IR-1) to (IR-11)] are shown below, however, these are not intended to limit the present invention.

(IR-1)

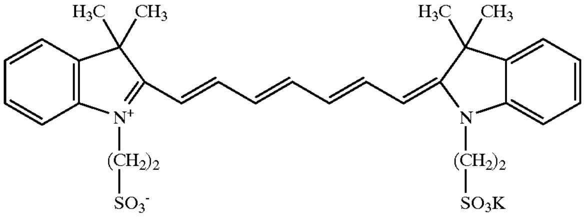

(IR-2)

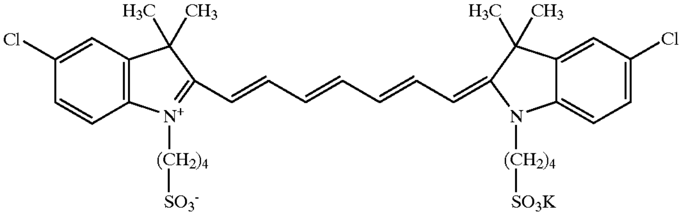

(IR-3)

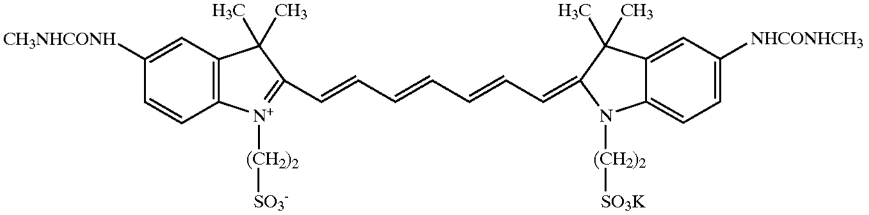

-continued
(IR-4)
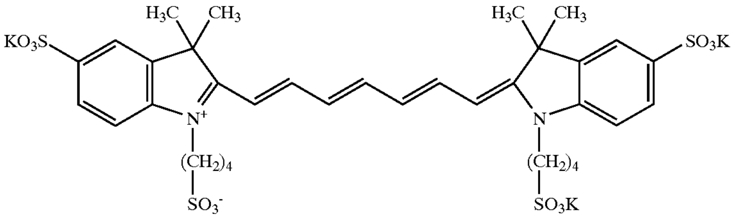
(IR-5)
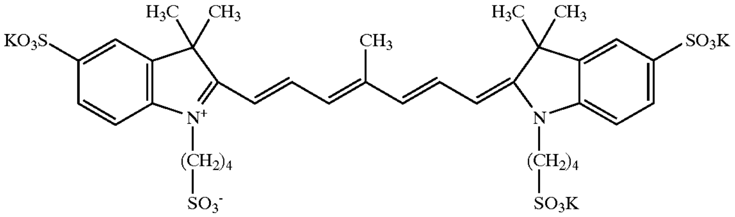
(IR-6)
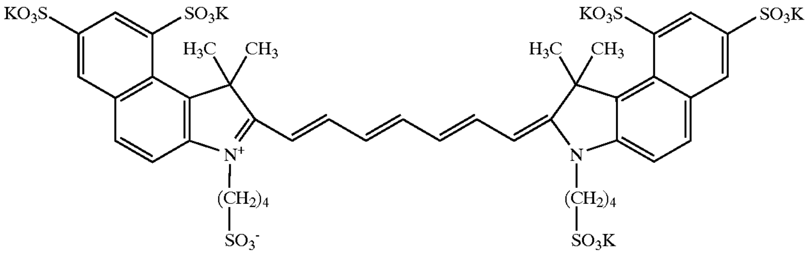
(IR-7)
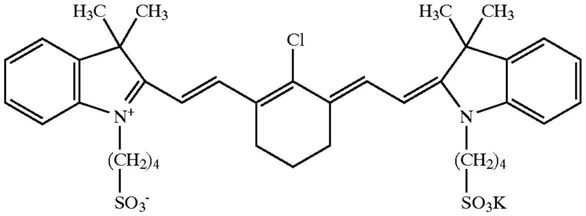
(IR-8)
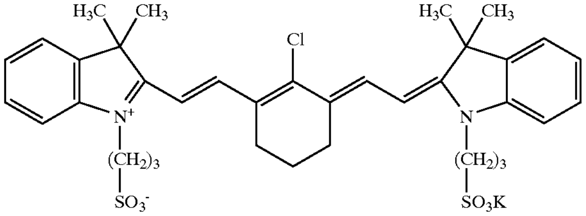
(IR-9)
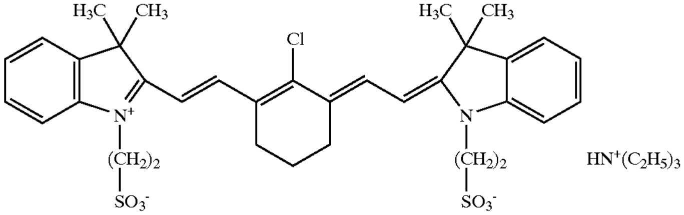
(IR-10)
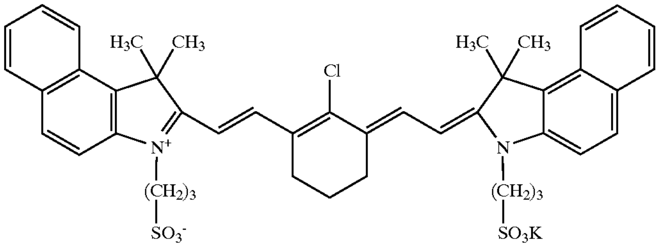

-continued (IR-11)

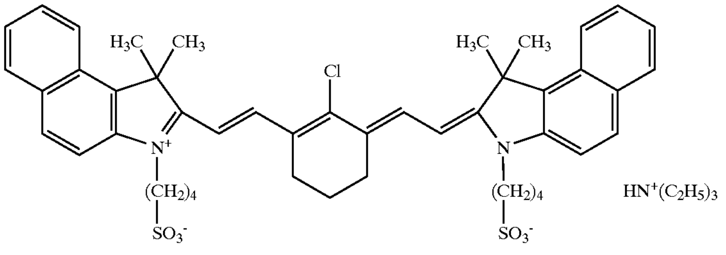

Pigments usable in the present invention include commercially available pigments and those described in Color Index (C. I.) Handbook; "Saishin Ganryo Binran" (Updated Pigment Handbook) edited by Nippon Ganryo Gijutsu Kyokai (Japan Pigment Technology Association), 1977; "Saishin Ganryo Oyo Gijutsu" (Advanced Pigment Application Technology), CMC Shuppan, 1986; and "Insatsu Inki Gijutsu" (Printing Ink Technology), CMC Shuppan, 1984.

Types of pigments include black pigments, yellow pigments, orange pigments, brown pigments, red pigments, violet pigments, blue pigments, green pigments, fluorescent pigments, metallic pigments, and polymer-binding pigments. Details of these pigments are described in JP-A No. 10-39509, paragraph Nos. [0052] to [0054], and the pigments described therein can also be used in the present invention. From a viewpoint of homogeneous dispersibility in the water-soluble photosensitive layer and improvement of water-dispersibility of the photosensitive layer, these pigments are preferably surface-treated to be hydrophilic.

These infrared absorbents may be used singly or in combinations thereof.

The amount of the infrared absorbent to be added to the photosensitive layer is 0.01 to 50% by weight, preferably 0.1 to 20% by weight, and more preferably 1 to 10% by weight. If the amount thereof to be added is less than 0.01% by weight, sensitivity of the photosensitive layer is decreased, and if the amount thereof to be added exceeds 50% by weight, strength of image portions is decreased and plate-wear resistance thereof tends to be decreased.

When a photosensitive layer containing an infrared absorbent is prepared, optical density at the absorption maximum in infrared region is preferably between 0.1 and 3.0. If the optical density is outside of this range, sensitivity of the photosensitive layer tends to be decreased. Since the optical density is determined by the amount of the added infrared absorbent and a thickness of the photosensitive layer, a predetermined optical density is obtained by controlling these conditions. The optical density of the photosensitive layer can be measured with a usual method. The measurement can be carried out, for example, by forming, on a transparent or white substrate, a photosensitive layer having a suitably determined thickness so that a dry coating amount thereof is within a range necessary as a planographic printing plate and measuring with a transmitting-type densitometer, or forming a photosensitive layer on a light-reflecting substrate such as an aluminum plate and measuring a reflection density, or the like.

(B) Radical Polymerization Initiator

As a radical polymerization initiator, known photopolymerization initiators, thermopolymerization initiators, or the like, can be used, and examples thereof include an onium salt, a triazine compound having a trihalomethyl group, a peroxide, an azo polymerization initiator, an organic boron compound, an azide compound, quinone diazide, and the like. Among them, an onium salt and an organic boron compound are preferable from a viewpoint of recording sensitivity.

Specific examples of the onium salt include an iodonium salt, a diazonium salt, a sulfonium salt, and the like. Although these onium salts can also function as an acid generator, they function as a radical polymerization initiator in the present invention since they are used in combination with a (C) radical polymerizing compound described later.

Preferable onium salts for use in the present invention include an iodonium salt, a diazonium salt and a sulfonium salt. These onium salts function as a radical polymerization initiator, not as an acid generator in the present invention. Preferable onium salts for use in the present invention are those represented by the following general formulae (1) to (3).

$Ar^{11}—I^+—Ar^{12}\ Z^{11-}$ General Formula (1)

$Ar^{21}—N^+{\equiv}N\ Z^{21-}$ General Formula (2)

General Formula (3)

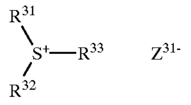

In formula (1), $Ar^{11}$ and $Ar^{12}$ each independently represents an aryl group having 20 or less carbon atoms which may have a substituent. If the aryl group has a substituent, preferable examples of the substituent include a halogen atom, a nitro group, a carhoxyl group, a sulfone group, a cyano group, a hydroxyl group, an alkyl group having 12 or less carbon atoms, an alkoxy group having 12 or less carbon atoms, and an aryloxy group having 12 or less carbon atoms. $Z^{11-}$ represents a counter ion selected from a group consisting of a halogen ion, a perchloric acid ion, a tetrafluoroborate ion, a hexafluorophosphate ion and a sulfonic acid ion, and is preferably a perchioric acid ion, a hexafluorophosphare ion or an arylsulfonic acid ion.

In general formula (2), $Ar^{21}$ represents an aryl group having 20 or less carbon atoms which may have a substituent. Preferable substituents include a halogen atom, a nitro group, a carboxyl group, a sulfon group, a cyano group, a hydroxyl group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion which is the same as $Z^{11-}$.

In general formula (3), $R^{31}$, $R^{32}$ and $R^{33}$ may be the same or different from each other, and each represents a hydrocarbon group having 20 or less carbon atoms which may have a substituent. Preferable substituents include a halogen atom, a nitro group, a carboxyl group, a sulfone group, a cyano group, a hydroxyl group, an alkyl group having 12 or less carbon atoms, an alkoxy group having 12 or less carbon atoms and an aryloxy group having 12 or less carbon aoms. $Z^{31-}$ represents a counter ion which is the same as $Z^{11-}$.

A preferable onium salt for use in the present invention is a water-soluble onium salt from a viewpoint that it can be homogeneously added into a hydrophilic matrix such as a hydrophilic resin in the photosensitive layer, and it does not impair water-solubility of the photosensitive layer.

Specific examples of preferable water-soluble onium salts are shown below, however, these are not intended to limit the present invention. Among them, exemplary compounds [OI-1] to [OI-2] are water-soluble onium salts represented by general formula (1), exemplary compounds [ON-1] to [ON-3] are water-soluble onium salts represented by general formula (2), and exemplary compounds [OS-1] to [OS-4] are onium salts represented by general formula (3).

OI-1

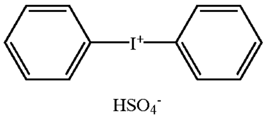

OI-2

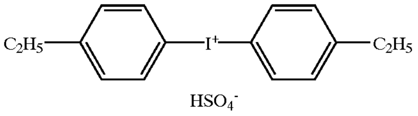

ON-1

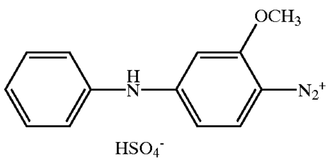

ON-2

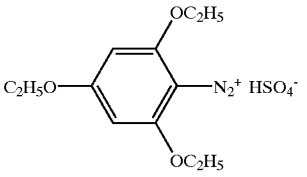

ON-3

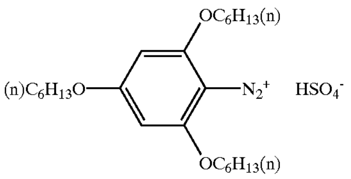

OS-1

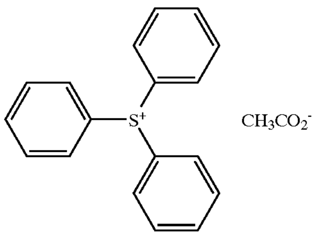

-continued

OS-2

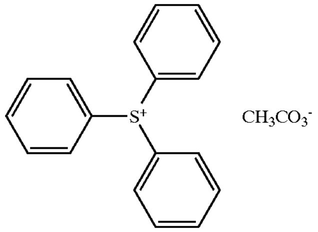

OS-3

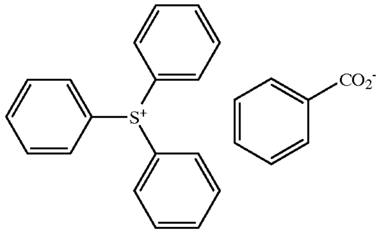

OS-4

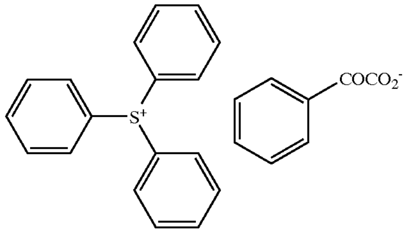

As a radical polymerization initiator other than the onium salt, an organic boron compound represented by the following general formula (4) is preferably used. By using the organic boron compound in combination with the infrared absorbent, radicals can be generated locally and highly efficiently in exposed regions. Particularly, by using an organic dye which absorbs light in infrared wavelength ranges in combination with the organic boron compound, sensitivity to light in the relevant wavelength range can be increased and recording using a light source emitting light in the relevant wavelength range can be preferably achieved.

General Formula (4)

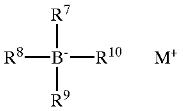

In general formula (4), $R^7$, $R^8$, $R^9$, and $R^{10}$ each independently represents an aliphatic group, an aromatic group, a heterocyclic group, or —Si($R^{11}$) ($R^{12}$) ($R^{13}$). $R^{11}$, $R^{12}$, and $R^{13}$ each independently represents an aliphatic group or an aromatic group.

The aliphatic group may be a cyclic aliphatic group or a chain aliphatic group. The chain aliphatic group may be branched.

If $R^7$ to $R^{10}$ represent aliphatic groups, preferable examples of the aliphatic groups include an alkyl group, an alkenyl group, an alkynyl group, an aralkyl group, or the like. Among them, an alkyl group, an alkenyl group and an aralkyl group are preferable, and an alkyl group is most preferable.

The alkyl group, and the like, listed above as examples may have a substituent, and examples of introducible substituents include a carboxyl group, a sulfo group, a cyano group, a halogen atom, a hydroxy group, an alkoxycarbonyl group having 30 or less carbon atoms, an alkylsulfonylaminocarbonyl group having 30 or less carbon atoms, an arylsulfonylaminocarbonyl group, an alkylsulfonyl group, an arylsulfonyl group, an acylaminosulfonyl group having 30 or less carbon atoms, an alkoxy group having 30 or less carbon atoms, an alkylthio group having 30 or less carbon atoms, an aryloxy group having 30 or less carbon atoms, a nitro group, an alkyl group having 30 or less carbon atoms, an alkoxycarbonyloxy group, an aryloxycarbonyloxy group, an acyloxy group having 30 or less carbon atoms, an acyl group having 30 or less carbon atoms, a carbamoyl group, a sulfamoyl group, an aryl group having 30 or less carbon atoms, an amino group, a substituted amino group, a substituted ureido group, a substituted phosphono group, a heterocyclic group, and the like.

In general formula (4), two or more of $R^7$, $R^8$, $R^9$ and $R^{10}$ may be bonded together directly or through a substituent to form a ring.

Examples of an anion moiety in the above general formula (4) include tetramethyl borate, tetraethyl borate, tetrabutyl borate, triisobutyl methyl borate, di-n-butyl di-t-butyl borate, tri-m-chlorophenyl n-hexyl borate, triphenyl methyl borate, triphenyl ethyl borate, triphenyl propyl borate, triphenyl n-butyl borate, trimesityl butyl borate, tritolyl isopropyl borate, triphenyl benzyl borate, tetra-m-fluorobenzyl borate, triphenyl phenethyl borate, triphenyl p-chlorobenzyl borate, triphenyl ethenylbutyl borate, di(α-naphthyl) dipropyl borate, triphenylsilyl triphenyl borate, tritoluylsilyl triphenyl borate, tri-n-butyl (dimethylphenylsilyl) borate, diphenyl dihexyl borate, tri-m-fluorophenyl hexyl borate, tri(5-chloro-4-methylphenyl) hexyl borate, tri-m-fluorophenyl cyclohexyl borate, tri-(5-fluoro-2-methylphenyl) hexyl borate, and the like.

In the above general formula (4), $M^+$ represents a group which can form a cation. Preferable examples thereof include an organic cationic compound, a transition-metal-coordinating-complex cation (such as compounds described in Japanese Patent No. 2,791,143), and a metal cation (such as $Na^+$, $K^+$, $Li^+$, $Ag^+$, $Fe^{2+}$, $Fe^{3+}$, $Cu^+$, $Cu^{2+}$, $Zn^{2+}$, $Al^{3+}$, ½$Ca^{2+}$, and the like).

Examples of the organic cationic compound include a quaternary ammonium cation, a quaternary pyridinium cation, a quaternary quinolinium cation, a phosphonium cation, an iodonium cation, a sulfonium cation, a dye cation, and the like. If the dye cation for the cation moiety absorbs light in infrared region, the organic boron compound functions both as an (A) infrared absorbent and a (B) radical polymerization initiator.

Specific examples of preferable water-soluble organic boron compounds ([OB-1] to [OB-4]) are shown below, however, these examples are not intended to limit the present invention.

OB-1

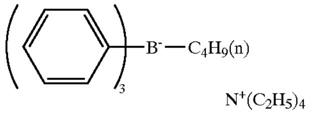

$N^+(C_2H_5)_4$

OB-2

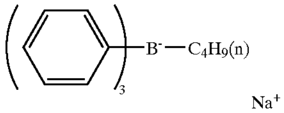

$Na^+$

OB-3

$((n)C_4H_9)_4B^-$ $Na^+$

-continued

OB-4

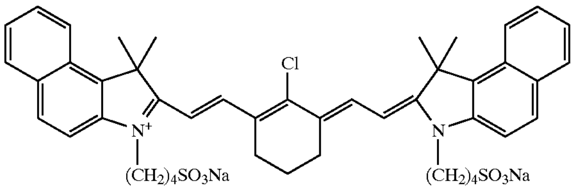

$((n)C_4H_9)_4B^-$

A maximum absorption wavelength of the radical polymerization initiator for use in the present invention is preferably 400 nm or less, and more preferably 360 nm or less. This absorption wavelength in ultraviolet region enables the image recording material to be handled under a white light.

The radical polymerization initiator may be used singly or in combination of two or more types thereof. The amount of the radical polymerization initiator to be added into the image recording material is 0.1 to 50% by weight, preferably 0.5 to 30% by weight, and more preferably 1 to 20% by weight of the total solid components of the image recording material. If the amount thereof to be added is less than 0.1% by weight, sensitivity is decreased. If the amount exceeds 50% by weight, strength of the image portions is decreased and plate-wear resistance thereof tends to be decreased.

(C) Radical Polymerizing Compound

The radical polymerizing compound for use in the present invention is a radical polymerizing compound having at least one ethylenic unsaturated double bond, and is selected from compounds having at least one, preferably two or more terminal ethylenic unsaturated bonds. Such a compound group is widely known in the relevant industrial field, and these compounds can be used in the present invention without any particular limitations. For example, a monomer, a prepolymer, i.e., a dimer, a trimer or an oligomer, or mixture thereof or copolymer thereof, or a polymer formed by introducing a cross-linking functional group into one of the compounds shown as examples of a (D) binder (described later), or the like, can be used. Examples of the monomer and the copolymer thereof include unsaturated carboxylic acids (such as acrylic acid, methacrylic acid, itaconic acid, crotonic acid, isocrotonic acid, maleic acid, and the like) as well as esters and amides thereof. Preferably, an ester of an unsaturated carboxylic acid and an aliphatic polyalent alcohol compound, or an amide of an unsaturated carboxylic acid and aliphatic polyalent amine compound is used. In addition, an adduct of an unsaturated carboxylic acid ester or amide having a nucleophilic substituent (such as a hydroxyl group, an amino group, a mercapto group, or the like) and a monofunctional or polyfunctional isocyanate or epoxy, a dehydrated condensate with a monofunctional or polyfunctional carboxylic acid, and the like, are also preferably used. Further, an adduct of an unsaturated carboxylic acid ester or amide having an electrophilic substituent (such as an isocyanate group or an epoxy group) and a monofunctional or polyfunctional alcohol, amine or thiol, as well as a substitution reactant of an unsaturated carboxylic acid ester or amide having a leaving substituent (such as a halogen group or a tosyloxy group) and a monofunctional or polyfunctional alcohol, amine or thiol are also preferable. Besides the above examples, examples which are included in a compound group in which the above-described unsaturated carboxylic acids are replaced by unsaturated phosphonic acids, styrenes, or the like, can also be used.

Specific examples of the radical polymerizing compound which is an ester of an aliphatic polyalent alcohol compound and an unsaturated carboxylic acid include acrylates such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri (acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, and the like.

As methacrylates, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane, bis-[p-(methacryloxyethoxy) phenyl] dimethylmethane, and the like, are included.

As itaconates, ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and the like, are included.

As crotonates, ethylene glycol dicrotonate, tetramethylene glycol dicrotonate, pentaerythritol dicrotonate, sorbitol tetradicrotonate, and the like, are included.

As isocrotonates, ethylene glycol diisocrotonate, pentaerythritol diisocrotonate, sorbitol tetraisocrotonate, and the like, are included.

As maleates, ethylene glycol dimaleate, triethylene glycol dimaleate, pentaerythritol dimaleate, sorbitol tetramaleate, and the like, are included.

Besides these esters, other esters such as aliphatic alcohol esters described in JP-B Nos. 46-27926, 51-47334, and JP-A No. 57-196231, those having an aromatic skeleton described in JP-A Nos. 59-5240, 59-5241, and 2-226149, and those including an amino group described in JP-A No. 1-165613, and the like, are also preferably used.

Specific examples of an amide monomer of an aliphatic polyalent amine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, xylylenebismethacrylamide, and the like.

Examples of other preferable amide monomers include those having a cyclohexylene structure described in JP-B No. 54-21726.

Further, an urethane addition-polymerizing compound produced by an addition reaction between an isocyanate and a hydroxyl group is also preferable, and specific examples thereof include vinylurethane compounds having two or more polymerizing vinyl groups in a molecule, which molecule is formed by adding a vinyl monomer containing a hydroxyl group represented by the following formula (5) to a polyisocyanate compound having two or more isocyanate groups in a molecule, described in JP-B No. 48-41708, and the like.

$$CH_2{=}C(R^{41})COOCH_2CH(R^{42})OH \qquad \text{General Formula (5)}$$

(wherein $R^{41}$ and $R^{42}$ represent H or $CH_3$)

Furthermore, urethane acrylates such as those described in JP-A No. 51-37193, JP-B Nos. 2-32293 and 2-16765, urethane compounds having an ethylene oxide skeleton described in JP-B Nos. 58-49860, 56-17654, 62-39417 and 62-39418 are also preferable.

Moreover, radical polymerizing compounds having an amino structure or sulfide structure in a molecule described in JP-A Nos. 63-277653, 63-260909 and 1-105238 may be used.

Other examples include polyfunctional acrylates or methacrylates such as polyester acrylates such as those described in JP-A No. 48-64183, JP-B Nos. 49-43191 and 52-30490, and epoxy acrylates formed by a reaction between an epoxy resin and a (meth)acrylic acid. Further, particular unsaturated compounds described in JP-B Nos. 46-43946, 1-40337 and 1-40336, vinylphosphonic acid compounds described in JP-A No. 2-25493, and the like, are included. In some cases, a structure having a perfluoroalkyl group described in JP-A No. 61-22048 is preferably used. In addition, those described as photo-curing monomers and oligomers in Nippon Setchaku Kyokai-shi (Journal of the Adhesion Society of Japan) 20, no. 7, (1984): 300-308 can also be used.

Details of usage of these radical polymerizing compounds (such as structure thereof, if they are used singly or in combination and an amount thereof to be added) can be suitably set according to a performance design of a final recording material.

For example, selection is made with consideration of the following points. With respect to sensitivity, a structure containing many unsaturated groups in a molecule is preferable, and that having two or more functional groups is preferable in many cases. In order to increase strength of image portions, i.e., cured film, a structure having three or more functional groups is preferable. Further, both sensitivity and strength can be adjusted by combining compounds having different numbers of functional groups and different polymerizing groups (such as acrylate compounds, methacrylate compounds, styrene compounds, and the like).

Since the photosensitive layer is required to be water-soluble in the present invention, it is preferable to use a water-soluble radical polymerizing compound, which relates to physical properties of the photosensitive layer. Examples of the water-soluble radical polymerizing compound include monomers, oligomers, polymers, and the like, having a hydrophilic functional group at their main chains, side chains or terminals.

Examples of the water-soluble radical polymerizing compound preferably usable in the present invention ([M-1] to [M-4]) are shown below, however, these are not intended to limit the present invention.

$$CH_2{=}CHCO(OC_2H_4)_nOCOCH{=}CH_2 \qquad \text{M-1}$$

$$CH_2{=}CHCO(OC_3H_6)_nOCOCH{=}CH_2 \qquad \text{M-2}$$

$$C_2H_5{-}C(CH_2OCH{=}CH_2)_3 \qquad \text{M-3}$$

$$C_2H_5{-}C(CH_2O[C_2H_4O]_2CH{=}CH_2)_3 \qquad \text{M-4}$$

Compatibility and dispersibility of the radical polymerizing compound with the other components in the photosensitive layer (such as a binder polymer, a radical polymerization initiator, a colorant, and the like) are determined according to its selection and usage, and the compatibility may be improved by using a low-purity compound or by combining two or more types of compounds.

With respect to a compounding ratio of the radical polymerizing compound in the photosensitive layer, if it is high, high sensitivity is obtained. However, if it is too high, undesirable phase separation is caused and viscosity of the photosensitive layer is increased, and this may cause problems in the production process (for example, production failure due to transfer and adhesion of photosensitive layer components), and the like. With consideration of these points, preferable compounding ratio of the radical polymerizing compound is generally 5 to 80% by weight of the total components (solid components) of the photosensitive layer, and more preferably 20 to 75 % by weight. The radical polymerizing compound may be used singly or in combination of two or more types thereof.

(D) Binder Polymer

In the present invention, it is preferable to use a binder polymer further in the photosensitive layer from a viewpoint of improving film properties. As the binder, a linear organic polymer is preferably used. Any known “linear organic polymer” can be used. Since the photosensitive layer is required to be water-soluble in the planographic printing plate precursor of the present invention, the binder is also selected from hydrophilic resins which have soluble or swelling property in water. If a hydrophilic resin is used as the binder, water development is enabled and excellent on-machine developability may be obtained.

Examples of preferable hydrophilic resins for use in the present invention include those having a hydrophilic group such as a hydroxyl group, a carboxyl group, a hydroxyethyl group, a hydroxypropyl group, an amino group, an aminoethyl group, an aminopropyl group, a carboxymethyl group, a sulfone group, and the like.

Specific examples of the binder include gum arabic, casein, gelatin, starch derivative, carboxymethylcellulose and sodium salt thereof, cellulose acetate, sodium alginate, vinyl acetate-maleic acid copolymers, styrene-maleic acid copolyniers, polyacrylic acids and salts thereof, polymethacrylic acids and salts thereof. homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acry late, polyethylene glycols, hydroxypropylene polymers, polyvinyl alcohols; as well as hydrolyzed polyvinyl acetate, polyvinyl formal, polyvinyl butyral, polyvinyl pyrrolidone having a hydrolysis degree of at least 60% by weight, and preferably at least 80% by weight; homopolyrner and copolymer of acrylamide, homopolymer and polymer of methacrylaniide, homopolymer and copolymer of N-methylolacrylamide, and the like.

The binder preferably has a cross-linking property. The binder component can be provided with the cross-linking property by introducing a cross-linking functional group such as an ethylenic unsaturated bond into a main chain or a side chain of a polymer. The cross-linking functional group may be introduced by copolymerization. Examples of the polymer having the ethylenic unsaturated bond in a main chain of a molecule include poly-1,4-butadiene, poly-1,4-isoprene, and natural and synthetic rubbers.

Examples of the polymer having the ethylenic unsaturated bond in a side chain of a molecule include polymers of ester or amide of acrylic acid or methacrylic acid, in which residue of ester or amide (R in —COOR or —CONHR) has the ethylenic unsaturated bond.

Examples of the residue (the R described above) having the ethylenic unsaturated bond include $-(CH_2)_n-CR^1{=}CR^2R^3$, $-(CH_2O)_n-CH_2CR^1{=}CR^2R^3$, $-(CH_2CH_2O)_n-CH_2CR^1{=}CR^2R^3$, $-(CH_2)_n-NH-CO-O-CH_2CR^1{=}CR^2R^3$, and $-(CH_2CH_2O)_2-X$ (wherein $R^1$ to $R^3$ each represents a hydrogen atom, a halogen atom, an alkyl group having 1 to 20 carbon atoms, an aryl group, an alkoxy group, and an aryloxy group, wherein $R^1$ and $R^2$ or $R^3$ may be bonded to each other to form a ring, n represents an integer from 1 to 10, and X represents a dicyclopentadienyl residue).

Specific examples of the ester residue include $-CH_2CH{=}CH_2$ (described in JP-B No. 7-21633), $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$, $-CH_2CH_2-NHCOO-CH_2CH{=}CH_2$, and $-CH_2CH_2O-X$ (wherein X is a dicyclopentadienyl residue).

Specific examples of the amide residue include $-CH_2CH{=}CH_2$, $-CH_2CH_2-Y$ (wherein Y is a cyclohexene residue), and $-CH_2CH_2-OCO-CH{=}CH_2$.

The above-described cross-linking polymer hardens when free radicals (polymerization initiating radicals or radicals which grow during polymerization of the polymerizing compound) are added to its unsaturated bonds, and addition polymerization is caused directly between polymers or via chain polymerization of the polymerizing compound to form cross-links between polymer molecules. Alternatively, the cross-linking polymer hardens when atoms (such as hydrogen atoms on carbon atoms adjacent to the unsaturated bond) in the polymer are extracted by free radicals to generate polymer radicals, and the polymer radicals are bonded to each other to form cross-links between polymer molecules.

Preferable examples of the water-soluble binder polymer for use in the present invention ([P-1] to [P-4]) are shown below. However, these examples are not intended to limit the present invention.

P-1

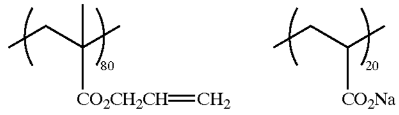

P-2

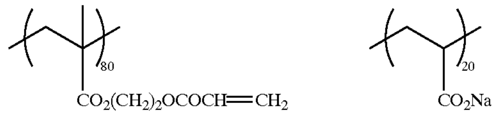

P-3

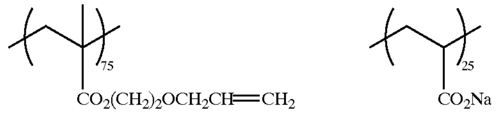

P-4

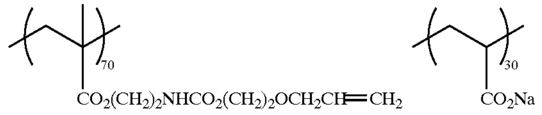

The weight average molecular weight of the binder polymer used in the present invention is preferably 5,000 or more, and more preferably in a range from 10,000 to 300,000. The number average molecular weight thereof is preferably 1,000 or more, and more preferably in a range from 2,000 to 250,000. The polydispersity degree (weight average molecular weight/number average molecular weight) thereof is preferably 1 or more, and more preferably ranges from 1.1 to 10.

The polymer may be any of a random polymer, a block polymer, a graft polymer, and the like, but is preferably a random polymer.

The polymer used in the present invention can be synthesized by a conventionally known method. Examples of a solvent used in the synthesis include tetrahydrofuran, ethylene dichloride, cyclohexanone, methyl ethyl ketone, acetone, methanol, ethanol, ethylene glycol monomethylether, ethylene glycol monoechylether, 2-methoxyethyl acetate, diethylene glycol dimethylether, 1-methoxy-2-propanol, 1-methoxy-2-propyl acetate, N, N-dimethylformamide, N,N-dirnethylacetamide, toluene, ethyl acetate. methyl lactate, ethyl lactate. dimethylsulfoxide, water, and the like. These solvents are used singly or in a combination thereof.

As the radical polymerization initiator used in synthesis of the polymer used in the present invention, known compounds such as an azo initiator, a peroxide initiator, or the like, can be used.

The binder polymer for use in the present invention may be used singly or in a combination of two or more types thereof. The amount of the polymer to be added in the photosensitive layer is 20 to 95% by weight, and preferably 30 to 90% by weight of the total solid components of the photosensitive layer. If the amount thereof to be added is less than 20% by weight, strength of the formed image portions is insufficient. If the amount thereof to be added exceeds 95% by weight, no image is formed. The weight ratio of the compound having ethylenic unsaturated double bond which can be polymerized by radical polymerization and the linear organic polymer preferably ranges from 1/9 to 7/3.

Other Components

In the present invention, other various compounds may further be added to the photosensitive layer as necessary. For example, a dye having a large absorption in the visible region can be used as a colorant for an image. Specific examples thereof include OIL YELLOW #101, OIL YELLOW #103, OIL PINK #312, OIL GREEN BG, OIL BLUE BOS, OIL BLUE #603, OIL BLACK BY, OIL BLACK BS, OIL BLACK T-505 (manufactured by Orient Chemical Industry, Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A No.62-293247. In addition, pigments such as phthalocyanine pigments, azo pigments, carbon black, titanium oxide, and the like, can also be preferably used.

It is preferable to add these colorants since they make it easier to discriminate between image portions and non-image portions after image formation. The amount thereof to be added is 0.01 to 10% by weight of the total solid components of the planographic printing plate precursor.

In the present invention, it is desirable to add a small amount of thermal polymerization inhibitor in order to inhibit unnecessary thermal polymerization of compounds having the ethylenic unsaturated double bond, which can be polymerized by radical polymerization, while the photosensitive layer is produced or the planographic printing plate precursor is stored. Suitable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitroso-N-phenylhydroxylamine aluminum salt, and the like. The amount of the thermal polymerization inhibitor to be added is preferably about 0.01 to about 5% by weight of the total weight of the whole composition. Further, in order to prevent inhibition of polymerization by oxygen, if necessary, a higher fatty acid derivative such as behenic acid or behenic acid amide, or the like, may be added and localized in the surface of the photosensitive layer during a drying process after coating. The amount of the higher fatty acid derivative to be added is preferably about 0.1 to about 10% by weight of the whole composition.

Furthermore, in order to widen ranges of developing conditions for stable processing, a nonionic surfactant described in JP-A Nos. 62-251740 and 3-208514 or an amphoteric surfactant described in JP-A Nos. 59-121044 and 4-13149 can be added to the planographic printing plate precursor of the present invention.

Specific examples of the nonionic surfactant include sorbitan tristearate, sorbitan monopalmitate, sorbitan trioleate, mono glyceride stearate, polyoxyethylene nonylphenyl ether, and the like.

Specific examples of the amphoteric surfactant include alkyl di(aminoethyl)glycine, alkyl polyaminoethylglycine hydrochloride, 2-alkyl-N-carboxyethyl-N-hydroxyethyl imidazolinium betaine, N-tetradecyl-N,N-betaine (for example, AMORGEN K, manufactured by Dai-Ichi Kogyo Co., Ltd.), and the like.

The ratio of the nonionic surfactant and the amphoteric surfactant in the planographic printing plate precursor is preferably 0.05 to 15% by weight, and more preferably 0.1 to 5% by weight.

Moreover, a plasticizer is added as necessary to the planographic printing plate precursor of the present invention for providing the film with flexibility, and the like. For example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, or the like, is used.

In order to form the photosensitive layer of the planographic printing plate precursor of the present invention, the above-described components are usually dissolved in a solvent to be coated on a suitable substrate. Examples of the usable solvent include, but are not limited to, ethylene dichloride, cyclohexanone, methyl ethyl ketone, methanol, ethanol, propanol, ethylene glycol monomethyl ether, 1-rnethoxy-2-propanol, 2-methoxy ethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrrolidone, dimethyl sulfoxide, sulfolane, γ-butvrolactone, toluene, water, and the like. These solvents are used singly or in combinations thereof. The concentration of the above-described components (total solid components including additives) in the solvent is preferably from 1 to 50% by weight.

The dry amount (solid) of the photosensitive layer coated on the substrate differs depending on an application, however, with respect to the planographic printing plate precursor, generally 0.5 to 5.0 g/m$^2$ is preferable. As the coated amount is decreased, apparent sensitivity is increased. However, film properties of the photosensitive film are impaired.

Coating can be carried out with various methods, and examples thereof include bar coater coating, rotation coating, spray coating, curtain coating, dip coating, air knife coating, blade coating, roll coating, and the like.

In order to improve coating properties of the photosensitive layer coating solution of the present invention, a surfactant such as a fluorine-containing surfactant described in JP-A No. 62-170950 can be added thereto. The amount thereof to be added is preferably from 0.01 to 1% by weight, and more preferably from 0.05 to 0.5% by weight of the total solid components of the planographic printing plate precursor.

Substrate

A substrate on which the photosensitive layer of the planographic printing plate precursor of the present invention can be coated is not particularly limited as long as it is a dimensionally stable plate-like material and has a necessary strength, flexibility, and the like. Examples thereof include paper, paper laminated with a plastic (such as polyethylene, polypropylene, polystyrene, or the like), metal plates (such as aluminum, zinc, copper, and the like), plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyinylacetal, and the like), paper and plastic films on which a metal such as described above is laminated or deposited, and the like. Among them, a polyester film and an aluminum plate are preferable as the substrate.

As the substrate for use in the planographic printing plate precursor of the present invention, it is preferable to use an aluminum plate which is light and is excellent in surface treatment property, processing property, and corrosion resistance. Preferable aluminum materials for this purpose include JIS 1050 material, JIS 1100 material, JIS 1070 material, Al—Mg alloy, Al—Mn alloy, Al—Mn—Mg alloy, Al—Zr alloy, Al—Mg—Si alloy, and the like.

The aluminum plate is subjected to surface treatments such as surface roughening, and is coated with the photosensitive layer to be produced as a planographic printing plate precursor. The surface roughening is carried out by one of, or a combination of two or more of mechanical roughening, chemical roughening, and electrochemical roughening. Further, an anodic oxidation for making the surface scratch resistant, and a treatment for increasing hydrophilicity of the surface may preferably be carried out.

Now, the surface treatments of the substrate are described below.

Prior to the surface roughening of the aluminum plate, a degreasing treatment for removing rolling oil on the surface using, for example, a surfactant, an organic solvent or an alkaline aqueous solution may be carried out, as necessary. If the degreasing is carried out using the alkaline aqueous solution, it may be followed by neutralization using an acidic solution and desmutting.

Then, the surface of the substrate is subjected to a so-called graining treatment for roughening the surface to improve adhesion between the substrate and the photosensitive layer and to provide the non-image portions with a water holding property. Specifically, the graining can be carried out by a mechanical graining such as sand blasting, or a chemical graining which uses an etchant containing an alkali, an acid or a mixture thereof to roughen the surface. In addition, electrochemical graining, or other known surface roughening methods such as adhering grains on the surface with an adhesive or other means having the same effect, pressing the substrate with a continuous belt or a roll which has a fine granular pattern on a surface thereof to imprint the substrate with the granular pattern, or the like, can be applied.

These surface roughening methods can be used in a combination thereof, and the order, the number of repetition, and the like are suitably selected. Since smut is generated on the surface of the substrate obtained through the above-described surface roughening, or graining, it is generally preferable to perform desmutting, such as washing with water or alkali etching, on the surface.

After the pretreatment such as described above, the aluminum substrate used in the present invention is usually subjected to anodic oxidation to form an oxide film on the substrate in order to improve abrasion resistance, chemical resistance, and water holding property thereof.

For the anodic oxidation of the aluminum plate, any electrolyte which forms a porous oxide film can be used, and generally, sulfuric acid, phosphoric acid, oxalic acid, chromic acid or a mixture thereof is used. The concentration of the electrolyte is suitably determined depending on the type of the electrolyte. Conditions for the anodic oxidation vary depending on the electrolyte to be used, and therefore cannot be specified. However, generally suitable ranges thereof are an electrolyte concentration of from 1 to 80% solution, a solution temperature of from 5 to 70° C., a current density of from 5 to 60A/dm$^2$, a voltage of from 1 to 100V and an electrolyzing time of from 10 seconds to 5 minutes. The amount of the anodized film is preferably 1.0 g/m$^2$ or more, and more preferably from 2.0 to 6.0 g/m$^2$. If the amount of the anodized film is less than 1.0 g/m$^2$, plate-wear resistance of the planographic printing plate will be insufficient and the non-image portions thereof will be easily scratched, and this tends to cause smudging due to ink adhering to the scratches during printing.

The center line average surface roughness of the substrate for the planographic printing plate is preferably from 0.10 to 1.2 μm. If it is less than 0.10 μm, adhesion between the substrate and the photosensitive layer decreases, and this causes a significant decrease in plate-wear resistance. If it is greater than 1.2 μm, a tendency of smudging during printing increases. The color density of the substrate is preferably from 0.15 to 0.65 in reflection density value. If it is brighter than 0.15, excessive halation is caused at the time of image exposure and image formation is hindered. If it is darker than 0.65, it becomes difficult to observe an image developed on the printing plate, and working efficiency of inspection of the printing plate after development is significantly lowered.

After the anodic oxidation, the aluminum substrate can be treated with an organic acid or a salt thereof, or can be provided with an undercoat layer before the photosensitive layer is coated thereon.

Intermediate Layer

An intermediate layer for improving adhesion between the substrate and the photosensitive layer may also be provided. In order to improve adhesion, the intermediate layer generally comprises a diazo resin, a phosphoric acid compound which is adsorbed, for example, on aluminum, and the like. The thickness of the intermediate layer is optional, however, it must be one which allows uniform bond-forming reaction between the intermediate layer and the photosensitive layer above. An amount of the intermediate layer to be coated of about 1 to 100 mg/m$^2$ in dry solid is generally preferable, and that of 5 to 40 mg/m$^2$ is particularly preferable. The ratio of the diazo resin to be used in the intermediate layer is 30 to 100%, and preferably is 60 to 100%.

After the surface of the substrate has been subjected to the above-described treatments and has been provided with the under coating, and the like, a back coating is provided on the back surface of the substrate, as necessary. As the back coating, a coating layer comprising a metal oxide obtained by hydrolysis and polycondensation of an organic polymer compound described in JP-A No. 5-45885 and an organic or inorganic metal compound described in JP-A No. 6-35174 is preferably used.

The planographic printing plate precursor of the present invention can be produced as described above.

Next, a planographic printing method of the present invention is described. The planographic printing plate precursor of the present invention is exposed imagewise with an infrared laser, and the exposed portions of the photosensitive layer harden. Since the photosensitive layer according to the present invention is intrinsically water-soluble, unexposed portions thereof are easily dissolved and dispersed in water. Therefore, without performing wet-type development using water or an alkali developing solution, the unexposed portions are easily removed with an aqueous component supplied during printing process. Thus plate-making is completed.

Exposure

This planographic printing plate precursor can be used for recording using an infrared laser or an ultraviolet lamp, and can also be used for thermal recording using a thermal head. In the present invention, image exposure is preferably carried out using a solid state laser or a semiconductor laser which emits an infrared ray in a wavelength range from 760 nm to 1200 nm. A laser output is preferably 100 mW or more. It is preferable to use a multi-beam laser device in order to reduce a total exposure time. An exposure time per pixel is preferably 20 μsec. or less. Energy irradiated on the planographic printing plate precursor is preferably 10 to 500 $mJ/cm^2$.

Printing

After being exposed with the infrared laser, the planographic printing plate obtained from the present invention can be set in the printing machine and printing can be carried out in this state without wet-type developing. Alternatively, the planographic printing plate precursor of the present invention can be set in the printing machine and exposed in the machine, and then printing can be carried out in this state.

When the printing plate precursor which has been exposed imagewise with the infrared laser is set in the printing machine without being subjected to a developing process such as wet-type development, and an aqueous component and an oil based ink are supplied thereto to start printing, exposed (heated) portions of the photosensitive layer which have hardened due to heat form oil-based-ink receiving areas having a lipophilic surface. While, unexposed portions of the photosensitive layer which are water-soluble are dissolved or dispersed by the aqueous component supplied onto the printing plate and are removed, and a hydrophilic surface is exposed at these portions. The aqueous component adheres onto the exposed hydrophilic surface (the unexposed areas), and the oil based ink adheres onto the exposed portions of the photosensitive layer, and thus printing is started.

The aqueous component and the oil based ink to be supplied are usually dampening water and an oil based ink for printing.

With these processes, the planographic printing plate is set in an offset printing machine, or the like, and can be used for printing a number of prints in this state.

EXAMPLES

Hereinafter, the present invention is described in more detail using examples, however, these examples are not intended to limit the present invention.

Examples 1 to 6

Preparation of Substrate

A melted JIS A1050 alloy comprising 99.5% or more of aluminum, 0.30% of Fe, 0.10% of Si, 0.02% of Ti and 0.013% of Cu was cleaned and then was cast. For the cleaning, degassing for removing unnecessary gas such as hydrogen in the melted alloy and ceramic tube filtering were carried out. The casting was carried out by die-casting. The surface of the solidified ingot thus formed having a thickness of 500 mm was shaved to a depth of 10 mm from the surface, and then, homogenization was carried out for 10 hours at 550° C. so as to prevent bulking of the intermetallic compound. Then, hot-rolling at 400° C. and intermediate annealing at 500° C. for 60 seconds in a continuous annealing furnace were carried out. Thereafter, cold-rolling was carried out to produce a rolled aluminum plate having a thickness of 0.30 mm. The center line average surface roughness Ra after the cold-rolling was controlled to be 0.2 μm by controlling the roughness of the rolling roll. Thereafter, the aluminum plate was processed with a tension leveler for increasing its flatness.

Next, surface treatments for preparing the planographic printing plate substrate were carried out.

First, degreasing for removing rolling oil on the surface of the aluminum plate was carried out using a 10% aqueous sodium aluminate solution at 50° C. for 30 seconds. Then, neutralization using a 30% aqueous sulfuric acid solution was carried out at 50° C. for 30 seconds, followed by desmutting.

Next, so-called graining for roughening the surface of the substrate was carried out in order to improve adhesion between the substrate and the photosensitive layer, and to provide the non-image portions with water holding property. An aqueous solution including 1% of nitric acid and 0.5% of aluminum nitrate was kept at 45° C., and while the aluminum web was moved in the aqueous solution, electrolytic graining was carried out by applying to the substrate electricity having a current density of $20A/dm^2$ and an anode-side quantity of $240C/dm^2$ in alternating waveform having 1:1 duty ratio from an indirect electric supply cell. Thereafter, etching using a 10% aqueous sodium aluminate solution at 50° C. for 30 seconds was carried out, and neutralization using a 30% aqueous sulfuric acid solution at 50° C. for 30 seconds and desmutting were carried out.

Further, in order to improve wear resistance, chemical resistance and the water holding property, an oxide film was formed on the substrate by anodic oxidation. As an electrolyte, a 20% aqueous sulfuric acid solution was used at 35° C., and while conveying the aluminum web in the electrolyte, the electrolysis was carried out with direct current of $14A/dm^2$ from an indirect electric supply cell to form an anodized film of 2.5 $g/m^2$.

Thereafter, in order to ensure hydrophilicity of the non-image portions of the printing plate, silicate treatment was carried out. The treatment was such that an 1.5% aqueous solution of #3 sodium silicate was kept at 70° C. and the aluminum web was conveyed so that the web was contacted the aqueous solution for 15 seconds, and then the web was washed with water. The amount of Si deposited on the aluminum web was 10 $mg/m^2$. The substrate thus prepared had Ra (center line surface roughness) of 0.25 μm.

Undercoating

Next, the following undercoating solution was coated on the aluminum substrate with a wire bar and dried at 90° C. for 30 seconds with a hot-air drier. The dry amount of the coating was 10 $mg/m^2$.

| <Undercoating Solution> | |
|---|---|
| Copolymer of ethyl methacrylate and sodium 2-acrylamide-2-methyl-1-propane sulfonate (molar ratio 75:15) | 0.1 g |
| 2-aminoethylphosphonic acid | 0.1 g |
| Methanol | 50 g |
| Ion-exchange water | 50 g |

Photosensitive Layer

Next, the following solution [P] was prepared, and immediately after the preparation of the solution, the solution was coated on the aluminum plate, which had been coated with the undercoating solution described above, with a wire bar. Then, the aluminum plate was dried at 115° C. for 45 seconds with a hot-air drier to provide negative-type planographic printing plate precursors [P-1] to [P-6]. The dry amount of the coating was 1.3 g/$m^2$.

Infrared absorbents and radical polymerization initiators used at this time are shown in Table 1. Note that, the radical polymerization initiator [OB-4] has a cyanine dye skeleton at a cation moiety which is a counter ion to a borate anion, and the cation moiety functions as the infrared absorbent.

The reflection densities of photosensitive layers of these planographic printing plate precursors measured at a maximum absorption in an infrared region ranged from 0.6 to 1.2.

| <Solution [P]> | |
|---|---|
| Infrared absorbent (one of the compounds listed in Table 1) | 0.10 g |
| Radical polymerization initiator (one of the compounds listed in Table 1) | 0.30 g |
| Monomer (one of the compounds listed in Table 1) | 1.00 g |
| Binder (one of the compounds listed in Table 1) | 1.00 g |
| Naphthalene sulfonate of Victoria Pure Blue | 0.04 g |
| Fluorine-containing surfactant (SURFLON S-113, manufactured by Asahi Glass Company) | 0.01 g |
| Water | 27.0 g |

TABLE 1

| | Infrared Absorbent | Radical Polymerization Initiator | Radical Polymerizing Compound | Binder |
|---|---|---|---|---|
| Example 1 | IR-7 | OI-1 | M-1 | P-1 |
| Example 2 | IR-7 | ON-1 | M-1 | P-1 |
| Example 3 | IR-7 | OS-1 | M-4 | P-1 |
| Example 4 | IR-7 | OB-1 | M-4 | P-1 |
| Example 5 | IR-9 | ON-1 | M-4 | P-2 |
| Example 6 | OB-4 | | M-1 | P-2 |

Exposure

The resulting negative-type planographic printing plate materials [P-1] to [P-6] were exposed using Trendsetter 3244VFS (manufactured by Creo) equipped with a water-cooling-type 40W infrared semiconductor laser under the following conditions: output was 9W, rotation speed of the outer surface drum was 210 rpm, energy at the plate surface was 100 mJ/$cm^2$, and resolution was 2400 dpi.

Printing

Without being developed after exposure, the planographic printing plates [P-1] to [P-6] were set in a printing machine, HEIDEL SOR-M (manufactured by Heidelberg Co., ltd.), and printing was carried out using a commercially available oil based ink (GEOS-G Ink N) and a 1% by volume aqueous solution of dampening water, EU-3 (manufactured by Fuji Photo Film Co., Ltd.). The dampening water was supplied first, and then the ink was supplied to start printing. At this time, a visual observation of whether or not smudging at non-image portions of the prints was caused was performed, and smudges were not observed on these planographic printing plates. Further, smudges were not observed on prints until the number of prints reached 50,000, and high quality prints with good ink adhesion were obtained.

Comparative Example 1

A planographic printing plate precursor [Q] was prepared similarly to Example 1, except that the binder polymer [P-1] in the solution [P] used in Example 1 was replaced with a polymer having the structure shown below, which was insoluble in water and soluble in an aqueous alkali solution. A photosensitive layer of the planographic printing plate precursor [Q] was soluble in an aqueous alkali solution, but insoluble or indispersible in water. As the resulting planographic printing plate precursor [Q] was exposed and used for printing similarly to Example 1, non-image portions thereof were not completely removed, and smudging of background areas was caused. Therefore, good prints could not be obtained.

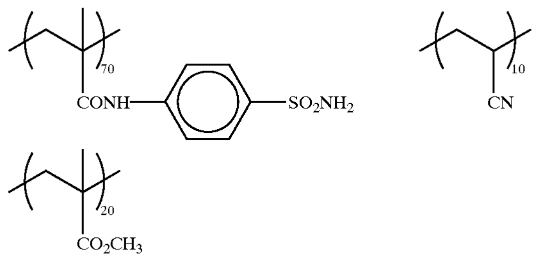

As described above, all of the planographic printing plate precursors of the present invention, which were provided with the photosensitive layer being soluble or dispersible in water, had excellent on-machine developability to provide good prints and excellent plate-wear resistance. On the other hand, the planographic printing plate precursor of Comparative Example, in which the water-insoluble binder polymer was used and the water-insoluble photosensitive layer was formed, had poor on-machine developability, and caused smudging on the non-image portions due to the residual film caused by defective developing, and therefore resulted in poor prints.

What is claimed is:

1. A planographic printing plate precursor comprising a photosensitive layer on a support, the photosensitive layer including an infrared absorbent, a radical polymerization initiator and a radical polymerizing compound, the photosensitive layer being recordable with irradiation with an infrared ray, and being at least one of soluble and dispersible in water.

2. The planographic printing plate precursor according to claim 1, wherein the photosensitive layer includes a binder.

3. The planographic printing plate precursor according to claim 2, wherein the binder comprises a radical polymerizing functional group.

4. The planographic printing plate precursor according to claim 2, wherein the binder is represented by the following formula:

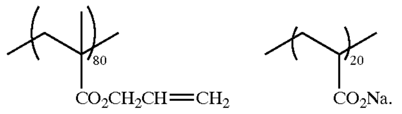

5. The planographic printing plate precursor according to claim 1, wherein the infrared absorbent is selected from the group consisting of cyanine dyes, squarylium dyes, pyrylium salts and nickel thiolate complex.

6. The planographic printing plate precursor according to claim 1, wherein the infrared absorbent is the cyanine dye represented by the following general formula (1):

General Formula (I)

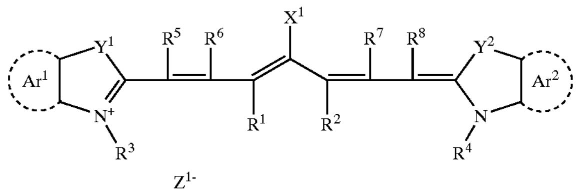

wherein $X^1$ represents a halogen atom or $X^2$-$L^1$; $X^2$ represents an oxygen atom or a sulfur atom; $L^1$ represents a hydrocarbon group having 1–12 carbon atoms; $R^1$ and $R^2$ each independently represents a hydrocarbon group having 1–12 carbon atoms; $Ar^1$ and $Ar^2$ respectively represent an aromatic hydrocarbon group which may have a substituent; $Y^1$ and $Y^2$ respectively represent a sulfur atom or a dialkylmethylene group having 12 or less carbon atoms; $R^3$ and $R^4$ respectively represent a hydrocarbon group having 20 or less carbon atoms which may have a substituent; $R^5$, $R^6$, $R^7$ and $R^8$ respectively represent a hydrogen atom or a hydrocarbon group having 12 or less carbon atoms; and $Z^{1-}$ represents a counter anion.

7. The planographic printing plate precursor according to claim 1, wherein the infrared absorbent is the following compound:

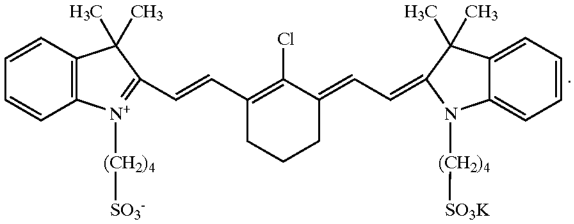

8. The planographic printing plate precursor according to claim 1, wherein the infrared absorbent is the following compound:

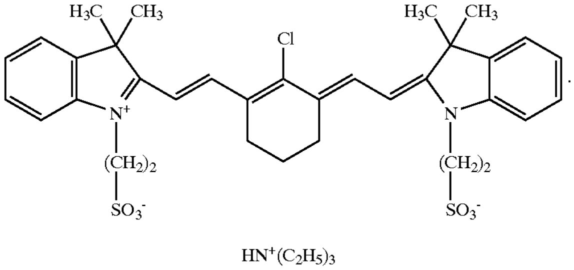

9. The planographic printing plate precursor according to claim 1, wherein the infrared absorbent is the radical polymerization initiator.

10. The planographic printing plate precursor according to claim 9, wherein the infrared absorbent and the radical polymerization initiator are the following compound:

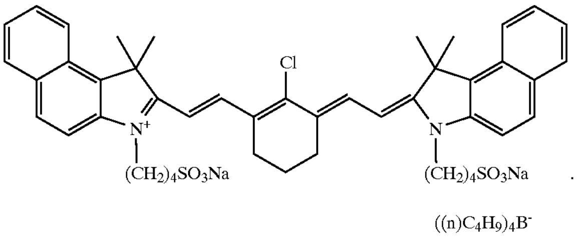

11. The planographic printing plate precursor according to claim 1, wherein the radical polymerization initiator is a water-soluble onium salt.

12. The planographic printing plate precursor according to claim 11, wherein the radical polymerization initiator is selected from the group consisting of an iodonium salt, a diazonium salt and a sulfonium salt.

13. The planographic printing plate precursor according to claim 12, wherein the radical polymerization initiator is the following compound:

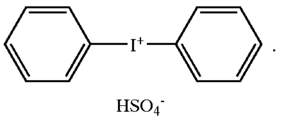

14. The planographic printing plate precursor according to claim 12, wherein the radical polymerization initiator is the following compound:

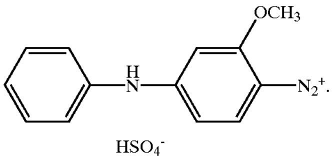

15. The planographic printing plate precursor according to claim 12, wherein the radical polymerization initiator is the following compound:

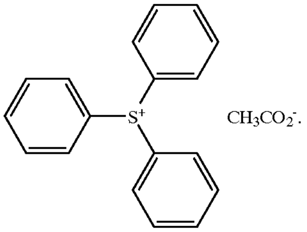

16. The planographic printing plate precursor according to claim 1, wherein the radical polymerization initiator is an organic boron compound.

17. The planographic printing plate precursor according to claim 16, wherein the radical polymerization initiator is the following compound:

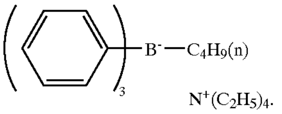

18. The planographic printing plate precursor according to claim 1, wherein the radical polymerizing compound is the following compound:

$C_2H_5$—$C(CH_2O[C_2H_4O]_2CH{=}CH)_3$

19. A planographic printing method comprising the steps of:

a) forming a planographic printing plate precursor by disposing a photosensitive layer able to record by irradiation with an infrared ray on a support, the photosensitive layer comprising an infrared absorbent, a radical polymerizing compound, and being at least one of soluble and dispersible in water;

b) image-wise exposing the planographic printing plate precursor by one of:

(i.) setting planographic printing plate precursor in a printing machine and then exposing the planographic printing plate precursor; and (ii.) exposing the planographic printing plate precursor with infrared laser light and then setting the exposed planographic printing plate in the printing machine; and c) printing by providing water components and oil based ink without use of a developing process.

* * * * *